United States Patent [19]

Bonora et al.

[11] Patent Number: 5,611,452
[45] Date of Patent: *Mar. 18, 1997

[54] SEALABLE TRANSPORTABLE CONTAINER HAVING IMPROVED LINER

[75] Inventors: Anthony C. Bonora, Menlo Park; Robert P. Wartenbergh, Woodside; Sudhir Jain, Fremont; Mark R. Davis, Mountain View, all of Calif.

[73] Assignee: Asyst Technologies, Inc., Fremont, Calif.

[ * ] Notice: The term of this patent shall not extend beyond the expiration date of Pat. No. 5,469,963.

[21] Appl. No.: 182,490

[22] Filed: Jan. 14, 1994

Related U.S. Application Data

[63] Continuation-in-part of Ser. No. 865,297, Apr. 18, 1992, Pat. No. 5,469,963.

[51] Int. Cl.$^6$ .................................................. B65D 85/30
[52] U.S. Cl. ........................ 220/378; 220/614; 220/681; 220/806; 414/217; 414/935; 206/454; 206/710; 141/98; 141/368
[58] Field of Search .................................. 141/65, 93, 98, 141/368; 414/217, 221, 222, 225, 226, 292, 935; 206/328, 334, 454, 455, 524.8, 710–712; 118/500; 220/358, 614, 681

[56] References Cited

U.S. PATENT DOCUMENTS

| | | | |
|---|---|---|---|
| 1,499,364 | 7/1924 | Goodrick | 220/358 X |
| 3,064,853 | 11/1962 | Lents et al. | 220/358 |
| 3,605,826 | 9/1971 | Carter | 141/93 |
| 4,458,291 | 7/1984 | Yanagisawa et al. | 206/328 |
| 4,502,598 | 3/1985 | Wartenbergh | 206/444 |
| 4,609,103 | 9/1986 | Bimer et al. | 206/328 |
| 4,616,683 | 10/1986 | Tullis et al. | 141/98 |
| 4,684,020 | 8/1987 | Ohlbach | 206/328 |
| 4,804,086 | 2/1989 | Grohrock | 206/328 |
| 4,815,912 | 3/1989 | Maney et al. | 414/217 |
| 4,830,182 | 5/1989 | Nakazato et al. | 206/334 |
| 4,906,494 | 3/1990 | Babinec et al. | 206/328 |
| 4,995,430 | 2/1991 | Bonora et al. | 141/98 |
| 5,024,329 | 6/1991 | Grohrock | 206/454 |
| 5,284,189 | 2/1994 | Best | 141/65 |

FOREIGN PATENT DOCUMENTS 0236323  7/1925  United Kingdom .................. 220/358

OTHER PUBLICATIONS

*Adapting Military Technology To Civilian Use: Contamination Removal and Collection Techniques*, By Steven P. Hotaling, USAF Rome Laboratory, *Microcontamination*, May 1993, pp. 21–27.

*Primary Examiner*—J. Casimer Jacyna
*Attorney, Agent, or Firm*—Fliesler, Dubb, Meyer & Lovejoy

[57] ABSTRACT

A transportable, sealable container, for example a Standard Mechanical Interface (or SMIF) pod, including a box and box door. The box has a first sealing surface and the box door has a second sealing surface. A liner, preferably stainless steel, is attached to the inside surface of the box door. An elastomer sealing material is integrally molded to the liner. The sealing material forms a first seal with the first sealing surface and a second seal with the second sealing surface when the box door is moved in a sealing position with respect to the box.

32 Claims, 11 Drawing Sheets

FIG.—5

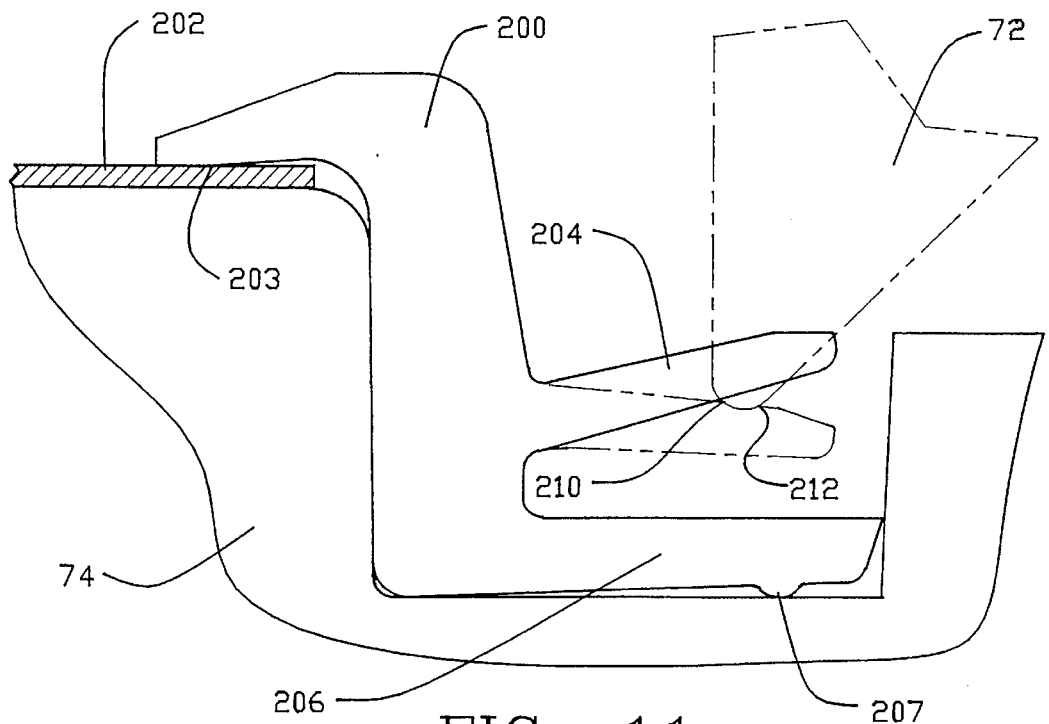
FIG.—11
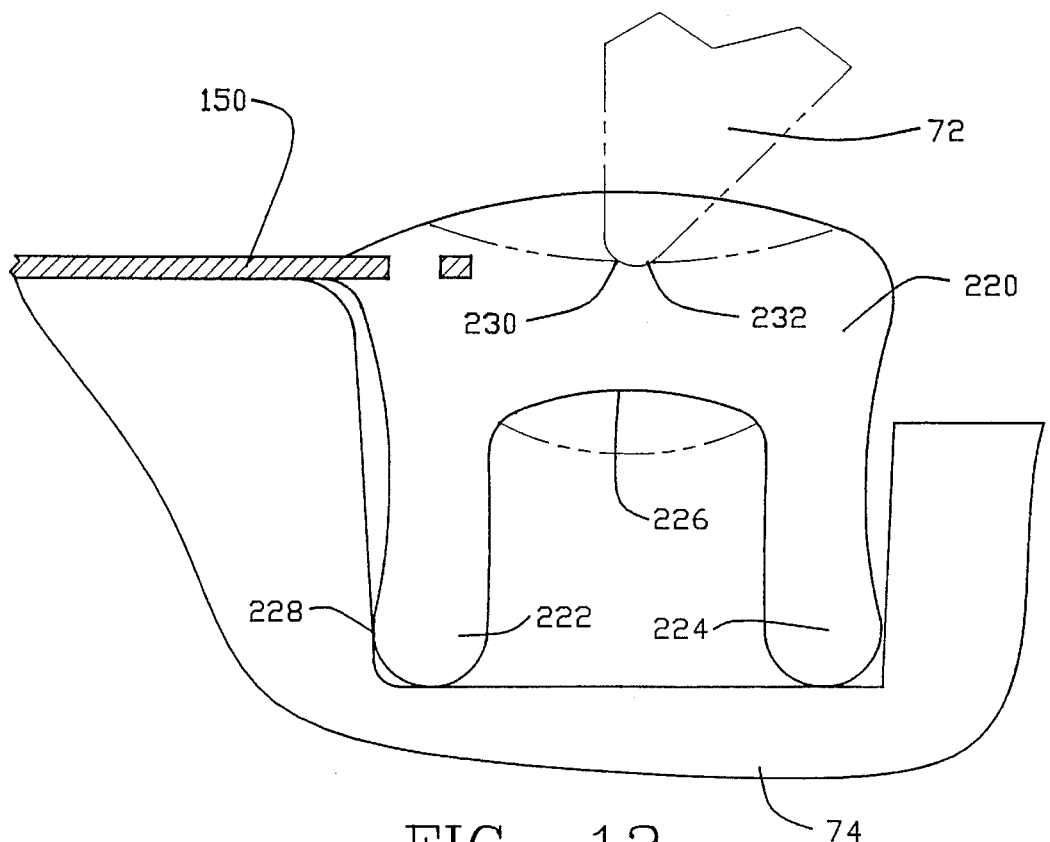
FIG.—12

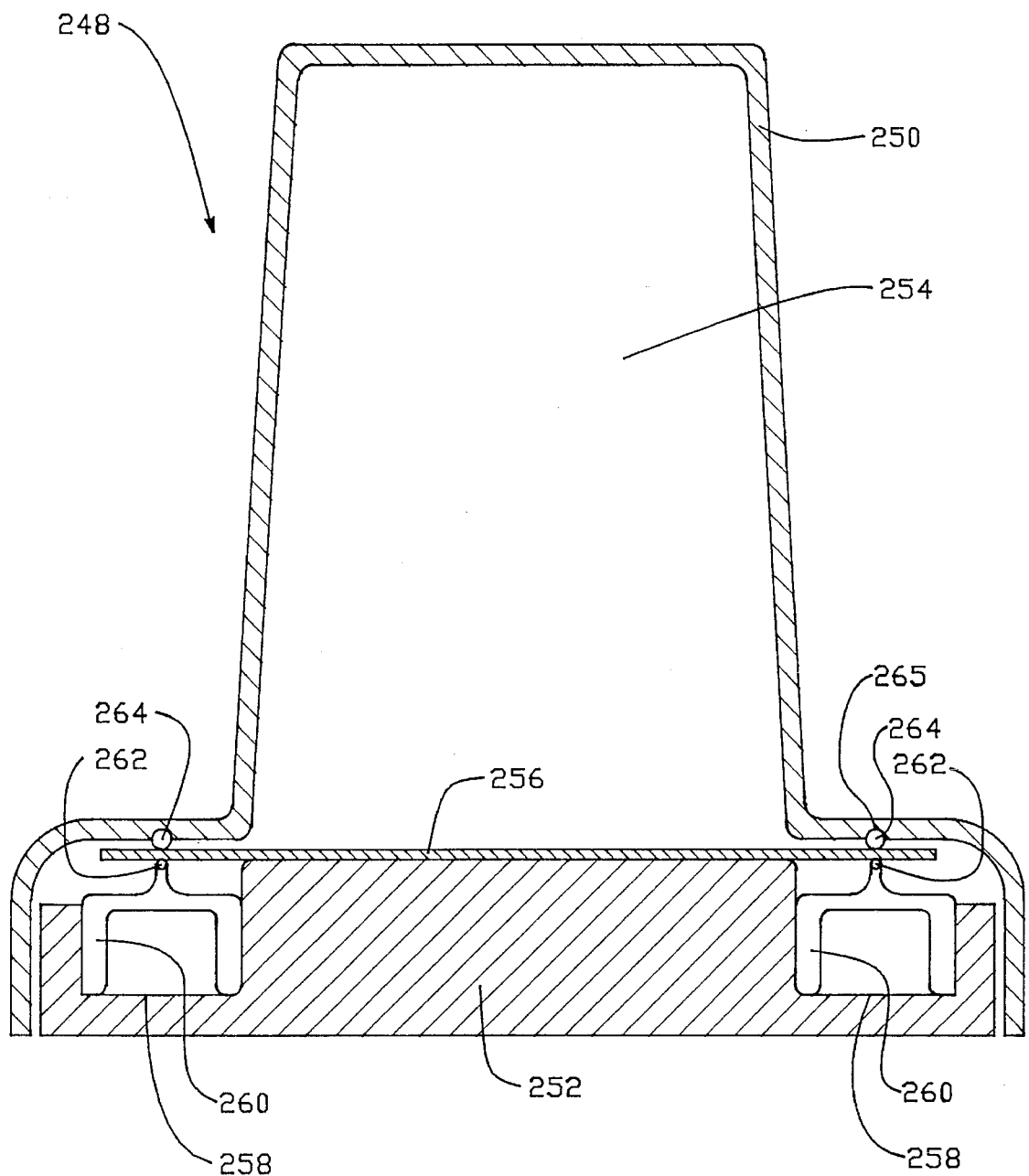
FIG.—13

SEALABLE TRANSPORTABLE CONTAINER HAVING IMPROVED LINER

CONTINUATION APPLICATION INFORMATION

This Application is a continuation-in-part of application Ser. No. 07/865,297, SEALABLE TRANSPORTABLE CONTAINER HAVING IMPROVED LINER, Bonora, et al., filed Apr. 18, 1992, now U.S. Pat. No. 5,469,963.

CROSS-REFERENCE TO RELATED PATENTS

This Application is related to the following Applications/Patents, all assigned to the assignee of the subject Application:

SHORT ARM MANIPULATOR FOR STANDARD MECHANICAL INTERFACE APPARATUS, U.S. Pat. No. 4,674,936;

SEALED STANDARD INTERFACE APPARATUS, U.S. Pat. No. 4,674,939;

LONG ARM MANIPULATOR FOR STANDARD MECHANICAL INTERFACE APPARATUS, U.S. Pat. No. 4,676,709;

SEALABLE TRANSPORTABLE CONTAINER HAVING A PARTICLE FILTERING SYSTEM, U.S. Pat. No. 4,724,874;

CONTAINER HAVING DISPOSABLE LINERS, U.S. Pat. No. 4,739,882;

BOX DOOR ACTUATED RETAINER, U.S. Pat. No. 4,815,912;

PROCESSING SYSTEMS WITH INTELLIGENT ARTICLE TRACKING, U.S. Pat. No. 4,974,166;

SEALABLE TRANSPORTABLE CONTAINER HAVING IMPROVED LATCH MECHANISM, U.S. Pat. No. 4,995,430;

INTELLIGENT WAFER CARRIER, U.S. Pat. No. 5,097,421; and

METHOD AND APPARATUS FOR TRANSFERRING ARTICLES BETWEEN TWO CONTROLLED ENVIRONMENTS, U.S. Pat. No. 5,169,272.

Each of these related Patents is incorporated herein by reference.

BACKGROUND OF THE INVENTION

Field of the Invention

The present invention relates to standardized mechanical interface (SMIF) systems for reducing particle contamination, and more particularly to transportable containers which are sealable to prevent influence of external factors on the contents of the containers, and which have a clean interior region.

Description of the Related Art

A standardized mechanical interface (SMIF) system proposed by the Hewlett-Packard Company is disclosed in U.S. Pat. Nos. 4,532,970 and 4,534,389. The purpose of a SMIF system is to reduce particle fluxes onto wafers and/or reticles. This purpose is accomplished, in part, by mechanically ensuring that during transportation and storage the gaseous media (such as air or nitrogen) surrounding the wafers is essentially stationary relative to the wafers and by ensuring that particles from the ambient environment do not enter the immediate wafer environment.

The SMIF concept is based on the use of a small volume of controlled (with respect to motion, gas flow direction and external contaminants), particle-free gas to provide a clean environment for articles. Further details of one proposed system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, July 1984, pp. 111–115.

Systems of the above type are concerned with particle sizes which range from below 0.02 µm to above 200 µm. Particles with these sizes can be very damaging in semiconductor processing because of the small geometries employed in fabricating semiconductor devices. Typical advanced semiconductor processes today employ geometries which are one half micron and under. Unwanted contamination particles which have geometries measuring greater than 0.1 µm substantially interfere with 1 µm geometry semiconductor devices. The trend, of course, is to have smaller and smaller semiconductor processing geometries which today in research and development labs approach 0.2 µm and below. In the future, geometries will become smaller and smaller and hence smaller and smaller contamination particles become of interest.

A SMIF system has three main components: (1) sealed pods, having a minimal volume, used for storing and transporting cassettes holding reticles or wafers; (2) enclosures placed over cassette ports and wafer processing areas of processing equipment so that the environments inside the pods and enclosures (after having clean air sources) become miniature clean spaces; and (3) a transfer mechanism to load/unload wafer cassettes from a sealed pod without contamination of the wafers in the wafer cassette from external environments.

Wafers are stored and transported in pods, and are transferred from a pod to processing equipment in the following manner. First, a pod is placed at the interface port on top of the enclosure. Each pod includes a box and a box door designed to mate with doors on the interface ports of the processing equipment enclosures. Then, latches release the box door and the enclosure port door simultaneously; the box door and the interface port door are opened simultaneously so that particles which may have been on the external door surfaces are trapped ("sandwiched") between the box and interface port doors. A mechanical elevator lowers the two doors, with the cassette riding on top, into the enclosure covered space. A manipulator picks up the cassette and places it onto the cassette port/elevator of the equipment. After processing, the reverse operation takes place.

The SMIF system has proven effective, both inside and outside a clean room, through use in semiconductor fabrication facilities and experiments. A SMIF system provides at least a ten-fold improvement over the conventional handling of open cassettes inside the clean room.

There are several areas in which conventional SMIF pods may be improved. First, conventional SMIF pods do not provide protection from electrostatic discharge (ESD). A contamination constraint is created by the need for conductivity; in molded plastic materials the preferred and most common ingredient for providing volumetric conductivity is carbon powder or fiber.

Second, the materials used to construct injection molded products and seals may release, through outgassing, materials which interfere with critical device fabrication processes. In this regard, studies with current generation 150 mm SMIF-Pods have shown significantly less surface contamination on wafers stored in pods than on wafers stored in ULPA filtered recirculating air-systems. Nevertheless, the materials approach used in pod construction can benefit from attention to internal outgassing sources.

Third, particle generation: In the course of normal production processing, a cassette of wafers will be loaded/unloaded from a SMIF-pod several hundred times, and will be subjected to many transport and placement operations. Each of these operations, as well as pod opening/closing, can generate particles, particularly where contact occurs between the cassette and supporting/retaining surfaces on the pod door.

Fourth, sealing: the functional importance of sealing the SMIF-Pod door has historically been based upon the requirement of providing a still-air environment for the wafers, to prevent cumulative particulate and surface contamination conditions generated by the numerous air changes per minute and other transient conditions in the general clean room. In many tests conducted on SMIF-Pods it has been determined that a "proximity" seal is adequate for excluding particulate sizes above approximately 0.5 μm, but a heavy concentration of smaller particles can in fact diffuse across small air gaps and eventually result in wafer surface contamination. Accordingly, a volume-compressible seal was incorporated in conventional pods to preclude diffusion-based particulate transfer. Subsequently, the development of SMIF-Based systems utilizing a controlled atmosphere condition for the pod and port-plate components has added additional requirements to sealing performance.

Conventional seals are formed using a poromeric, volume compressible material which is fundamentally a polyurethane foam of controlled porosity and durometer. This material was developed for use in applications such as disk drive gasketing, clean room filters and cabinet assemblies. Cycle testing has shown that this material had excellent properties in terms of compression set, resistance to abrasion and particulation, and dimensional accuracy. Nevertheless, trace gas analysis results now indicate that outgassing from this seal may exist for certain type product applications. Furthermore, conventional seals may not function optionally when the sealing surfaces on the SMIF-Pods contain irregularities; for example, from wear.

Fifth, cleaning: Historically, cleaning of SMIF pods has been performed in a manner similar to that used for other semiconductor handling products using a combination of deionized wafer and a non-ionic surfactant followed by thorough rinsing and air drying. Based on SMIF-user experience to date, this has been an effective approach for particle build-up control down to at least the 0.3 μm level.

Future trends, however, point to the need for a cleaning approach which could provide improved levels of cleanliness for smaller particles as well as minimizing any possibility of introducing contamination during cleaning, i.e. organics, particles and residual moisture. Several new technologies have recently emerged that could enable a "dry" cleaning process to be used for pod component cleaning. An improved cleaning system would also ideally be compact enough to be located in the Fab area itself. Appropriate design of the internal pod elements and the cleaning system would facilitate cleaning with a minimum of human interaction for disassembly/reassembly.

Sixth, complicated sealing arrangements tend to increase manufacturing costs. Finally, manufacturing facilities tend to store and/or use chemicals that when exposed to sealing materials, impair or ruin the seal.

SUMMARY OF THE INVENTION

It is, therefore, an object of the present invention to provide an improved SMIF pod.

Another object of the present invention is to provide a SMIF based handling system which provides ESD control; in particular, an environment in which a conductive cassette can be maintained at ground potential during storage, pod opening, gripper transfer, and placement on process equipment.

Another object of the present invention is to provide a pod molded of a material exhibiting volume conductivity qualities.

Another object of the present invention is to provide a path for conducting any charge which may be present on the wafers and/or cassette to ground with a path of predictable resistance.

Another object of the present invention is to provide a pod in which the materials of pod construction, particularly those in immediate contact with cassette or wafers, are either conductive or not susceptible to charge build-up.

Another object of the present invention is to provide a sealing approach for a SMIF pod which can ultimately meet one or more of the following requirements: effective barrier to particle intrusion; non-particle generating during repetitive cycling; non-outgassing relative to balance of system components; low level of compression set during extended storage or repetitive cycling; non-porous to prevent gaseous diffusion; secure gas-tight sealing; greater imperviousness to chemical attack; and lower manufacturing cost.

These and other objects of the present invention are provided by proper material choices for the wafer cassette and its corresponding support/contact surfaces in the SMIF pod, Preferred combinations would be those that mate a hi-lubricity non-sloughing cassette material against a smooth finished relatively hard pod door upper surface. ESD protection is provided by utilizing a conductive liner on the pod door which provides a low resistance path to the pod door from a conductive cassette. The pod door includes a conductive path to ground potential.

A membrane is provided over the conductive liner and is bonded to the conventional sealing gasket. The membrane has an opening to allow the wafer cassette to sit on the conductive liner. The membrane isolates the gasket from the interior of the pod, thereby eliminating the gasket as a contamination source. The conductive liner, preferably formed of stainless steel, replaces conventional vacuum formed plastic PVC liners and reduces outgassing from the plastic liners. The smooth, hard finish of the conductive liner minimizes particle generation at the cassette contact areas.

A second embodiment includes a pod door liner, preferably stainless steel, with a sealing material integrally molded to the liner. The sealing material has a lip which receives the edge of the pod. When the lip receives the pod, the lip deflects, forming a first seal with the pod and causing a second portion of the sealing material to form a second seal with the pod door.

In particular, the first embodiment of the present invention relates to a sealable, transportable container, comprising: a pod having an interior region and a sealing surface; a pod door having an interior surface; an electrically conductive liner provided on said interior surface of said pod door; a gasket provided on said pod door, said gasket having a configuration corresponding to the configuration of said sealing surface of said pod; a membrane overlying and bonded to said electrically conductive liner and said gasket, said membrane having an opening which exposes said conductive liner; and latch means for securing said pod door to said pod.

The second embodiment relates to a sealable, transportable container, comprising: a pod having an interior region and a first sealing surface; a pod door having an interior surface and a second sealing surface; a liner provided on the interior surface of said pod door; a sealing material, separate from and attached to the liner, so that when the pod door is moved to a sealing position with respect to the pod the sealing material comes in contact with the first sealing surface and the second sealing surface.

In one alternative, the sealing material can be elastomer, include a lip and a bead, and be integrally molded to the liner. Moving the pod door to a sealing position with respect to the pod causes the lip to come in contact with and be deflected by the first sealing surface, forming a first seal, and causes the bead to come in tighter contact with the second sealing surface, forming a second seal. The first sealing surface can be shaped like a knife edge.

These and other objects and advantages of the invention will appear more clearly from the following description in which the preferred embodiments of the invention have been set forth in detail in conjunction with the drawings.

BRIEF DESCRIPTION OF THE DRAWINGS

FIG. 11 is a side view of the fourth embodiment seal engaging the liner, pod and pod door.

FIG. 12 is a side view of the fifth embodiment seal engaging the liner, pod and pod door.

FIG. 13 is a cutaway side view of a sixth embodiment seal and SMIF pod.

DESCRIPTION OF THE PREFERRED EMBODIMENTS

The present invention will be described in the context of a SMIF system for storing and transporting wafers and/or reticles. However, it is to be understood that a sealable, transportable container in accordance with the present invention may be used to store and transport many other inanimate objects, as well as living objects such as laboratory animals.

The general structure of a SMIF pod and the mating of a SMIF pod with processing equipment are described in U.S. Pat. No. 4,724,874 which is hereby incorporated by reference. However, for completeness, a brief description of the disclosure is provided herein.

Figures 1A, 1B:
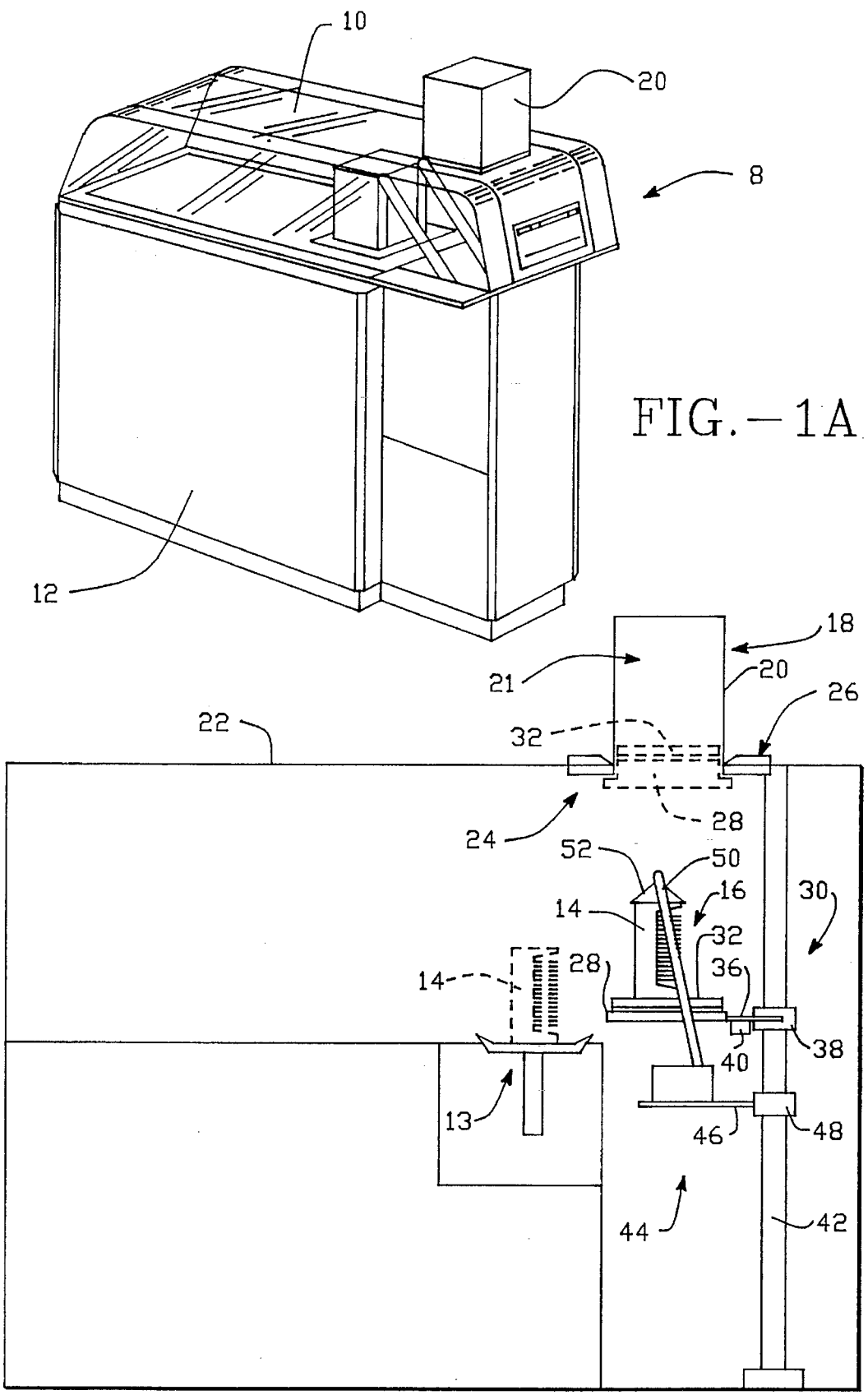
FIG. 1A is an isometric view of a processing station having a canopy for receiving a SMIF pod.
FIG. 1B is a cutaway side view of the processing station of FIG. 1.

FIGS. 1A and 1B illustrate a processing station 8 having an enclosure 10 which is an easily removable shield that covers the wafer handing mechanism of processing equipment 12. Equipment 12 may be, for example, a photo resist applicator, mask aligner, inspection station or any similar processing equipment. The enclosure 10, which is constructed of transparent plastic, such as acrylic, to facilitate visual inspection and/or maintenance within the enclosure 10, covers the handling mechanisms of the processing equipment 12 and a holder 14, such as a wafer cassette holding wafers 16. The environment within the processing equipment is separately maintained and separately cleaned, and therefore, the equipment 12 need not be installed in a clean room.

Sealable, transportable container 18 includes a box 20 (alternatively identified as a box top or a pod) having an interior region 21 and a box door (or pod door) 32. Container 18 is mounted on the horizontal surface 22 of enclosure 10 by a port assembly 24. The port assembly 24 includes a port plate 26, port door 28, and an elevator mechanism 30. Elevator mechanism 30 transports a wafer cassette 14, containing integrated circuit wafers 16, from the interior region 21 of box 20 into the region beneath the enclosure 10. In FIG. 1B, port door 28 and box door 32 are shown in the closed position by the dotted lines. Elevator assembly 30 includes a platform 36, a shaft engagement device 38 and a drive motor 40. The platform 36, extending from the elevator assembly 30, carries the port door 28, the box door 32 and cassette 14 in a vertical direction. The platform 36 is attached by engagement device 38 to a vertical guide 42 of elevator assembly 30.

Typically, guide 42 includes a lead screw (not shown) and the drive motor 40 drives a gear (not shown) which engages the lead screw for driving the platform 36 up or down. When the platform 36 is driven to the closed position, the port door 28 closes the port opening in the enclosure 10.

In a similar manner, the manipulator assembly, shown generally by the numeral 44, includes platform 46 which has engagement means 48 for engaging the vertical guide 42. Manipulator assembly 44 includes a manipulator arm 50 and an engagement head 52 adapted to engage cassette 14. By vertical operation of the platforms 36 and 46 and by operation of the manipulator assembly 44, cassette 14 is moved from its position on the box door 32 to a position on the equipment station 13 (as shown by the broken lines).

Figure 2:
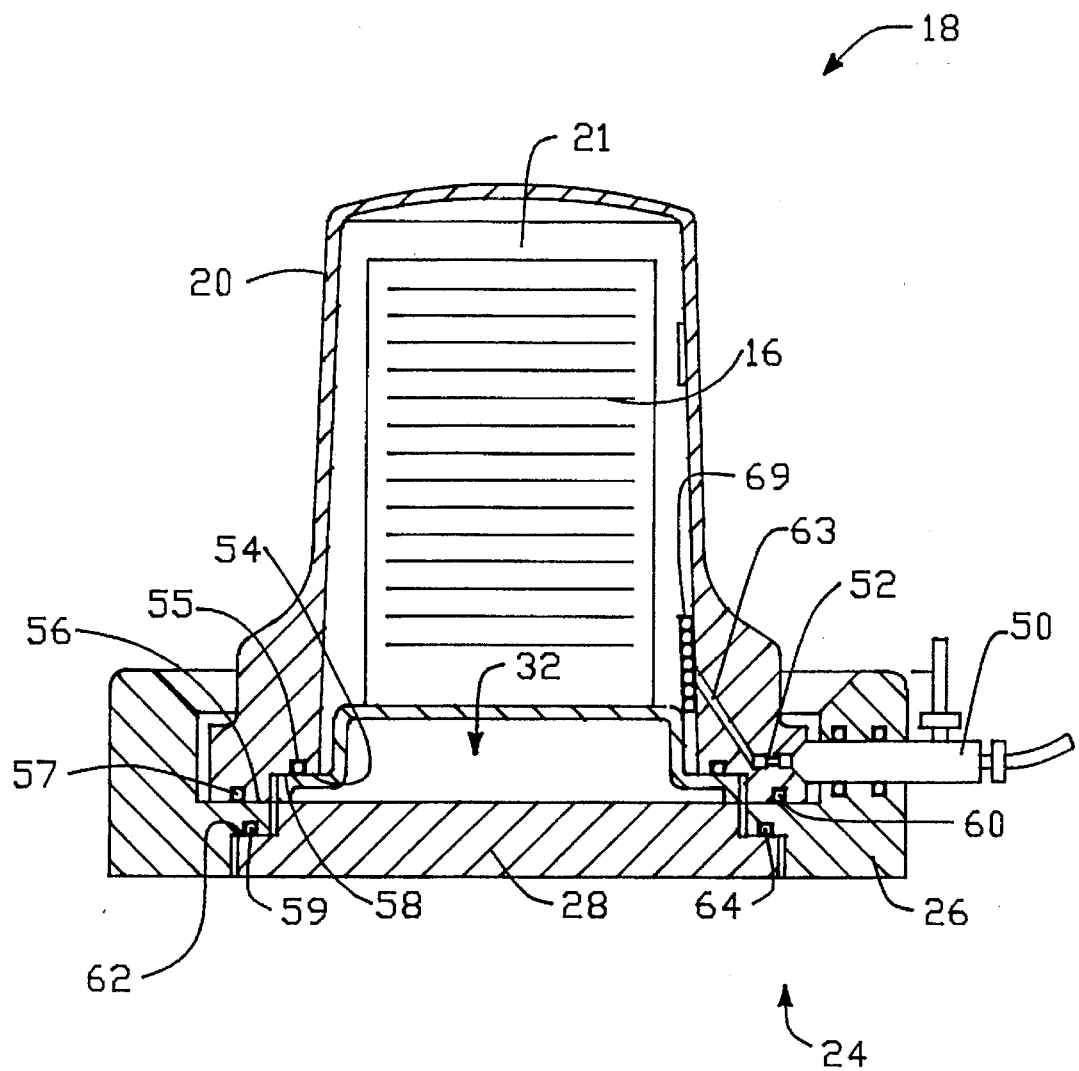
FIG. 2 is a sectional view of a SMIF pod and portions of a port assembly for receiving the SMIF pod.

FIG. 2 shows container 18 mated to port assembly 24 of processing equipment 12. Container 18 is designed for sealably mating with the port assembly 24, and thus box 20 has first and second box top sealing surfaces 54, 56, respectively. Box door 32 has a first box door sealing surface 58 for sealably mating with the first box top sealing surface 54, and gasket 55 between surfaces 54 and 58 provides a seal. Port plate 26 has first and second port plate sealing surfaces 60, 62, respectively. The first port plate sealing surface 60 sealably mates with the second box top sealing surface 56, making a second seal as gasket 57 is compressed.

Port door 28 has a first port door sealing surface 64 which sealably mates with the second port plate sealing surface 62; a third seal is provided by gasket 59. The box top 20 may include a conduit (channel) 63 defining a channel between valve 52 and the interior space 21 of box 20. At one end of channel 63 is a filter 69 for filtering fluids (e.g., gasses) passing therethrough.

When the first, second and third seals are made, the interior space 21 of box 20 may cleaned by alternately evacuating/back-filling the interior space 21. Container 18 can be alternately back-filled or evacuated when box 20 and box door 32 are sealed together to isolate the interior region 21 of box 20 from ambient conditions.

U.S. Pat. No. 5,169,272, which is incorporated herein by reference, discloses an apparatus and a method for transferring articles from a SMIF pod to a processing station or transferring articles from a processing station to a SMIF pod in which the environment inside the SMIF pod is purged before the environment is exposed to the atmosphere inside the processing station. One manner of purging the SMIF pod is to create a non-contact gas seal by opening the port door of the processing station by a small amount and to create a differential pressure with respect to the pressure in the SMIF pod. The differential pressure is defined as the relationship of the relative pressures in the SMIF pod, the processing station, a gas inlet to the port assembly of the processing station, and a gas outlet form the port assembly. The differential pressure causes the gas inside the processing equipment to escape through the small aperture between the port door and the processing station, thereby preventing gas from entering the interior region of the processing station through the non-contact gas seal. In conjunction with providing the gas seal, a reduced pressure is created in the port region of the processing equipment in order to remove contaminates and the gas from both the pod door and the interior region of the pod as the pod is opened. The gas seal is maintained until the purging of the interior environment of the SMIF pod is completed. The pod loading or unloading operation includes lowering the pod door to a first position to open the pod and to allow the atmosphere inside the pod door to be purged, lowering the pod door to a second position to allow the interior region of the pod to be purged, and lowering the pod door to a third position in which materials may be transferred to or from the pod.

Port plate 26 is connectable to a coaxial injector/extractor 50 at gas transfer valve 52. In order to evacuate interior space 21, injection/extractor 50 is activated to withdraw fluid from interior space 21. As the fluids are withdrawn, they pass through filter 69, through channel 63 and through a coaxial valve (not shown) of injection/extractor 50.

Figure 3:
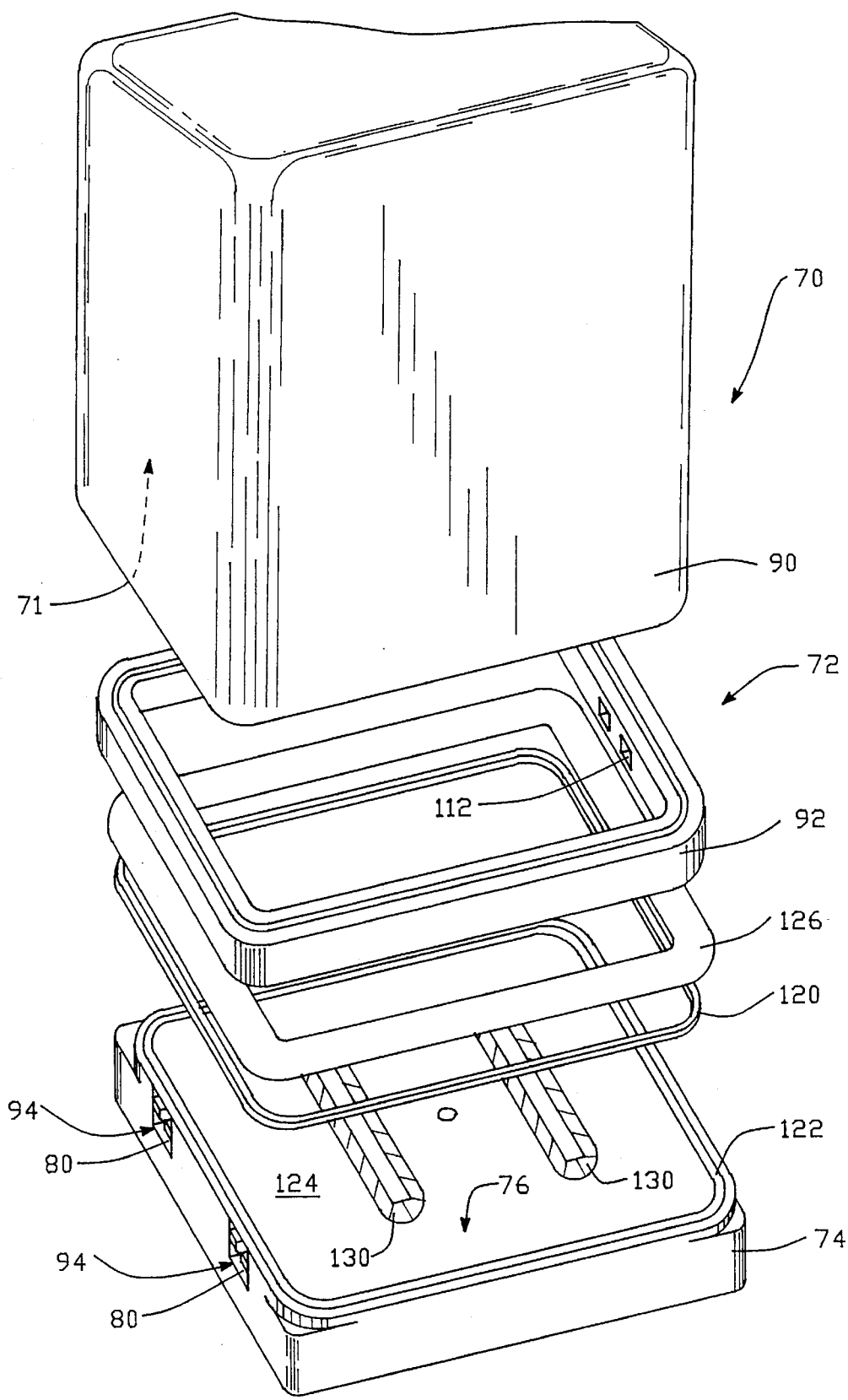
FIG. 3 is an isometric, exploded view of a second embodiment SMIF pod.

FIG. 3 shows a container 70 which is similar to container 18 of FIGS. 1–2, but with an alternative sealing arrangement between the box top and box door. Container 70 includes box 72 and box door 74. Box 72 comprises a domed housing 90 and a ring-like engaging portion 92. Housing 90 and engaging portion 92 may be formed integrally, for example, by injection molding, or as separate components assembled to form box 72. A gasket 120, which provides the seal between box 72 and box door 74 resides in a gasket-retaining slot 122 in box door 74. A latch mechanism space 80 (not completely shown) is housed in box door 74 and latch mechanism 80 protrudes from box door 74 through windows 94 to engage latch engaging surfaces 112 of box 72.

Figure 4:
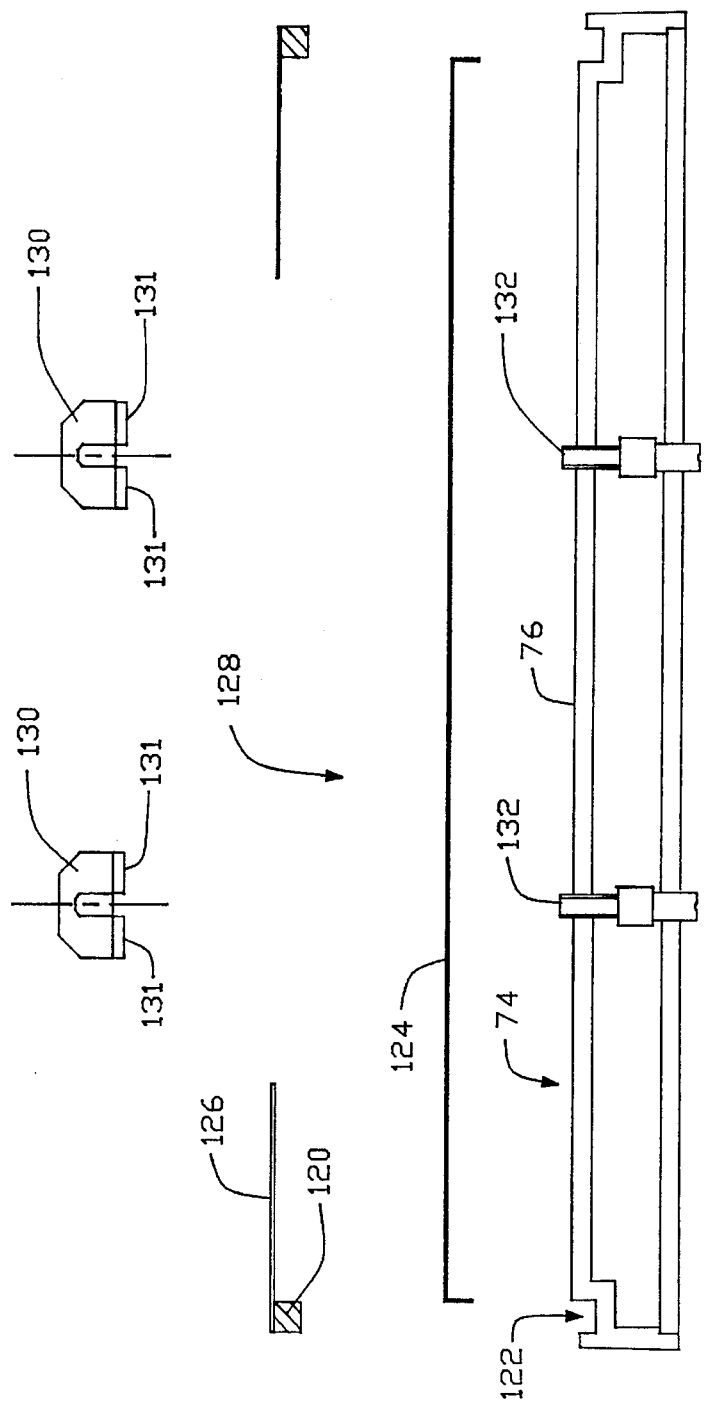
FIG. 4 is an exploded, schematic, sectional view of a pod door of the second embodiment.

The liner structure for a SMIF pod in accordance with the present invention will be described with reference to FIGS. 3 and 4. Box door 74 has an interior surface 76, which defines the portion of pod door 74 exposed to interior region 71 of pod 72. A conductive liner 124 is provided on interior surface 76 of pod door 74. The conductive liner may be formed of, for example, stainless steel or conductive plastic. The conductive liner 124 provides a clean (low outgassing, low particle generation, non-corrosive), conductive support surface for cassette 14, and the liner is easy to replace. Stainless steel liner 124 provides excellent conductivity and has low particle generation and outgassing characteristics.

Conductive liner 124 is electrically connected to pod door 74, and pod door 74 includes a conductive path which is connected to a fixed potential, e.g., ground potential, external to the pod 72. The conductive path through pod door 74 may be provided by forming the pod door 74 of conductive materials, or providing a conductor, e.g. a wire, in pod door 74.

Membrane 126 is laminated or bonded to gasket 120 and conductive liner 124 in order to isolate gasket 120 from the interior region 71 of pod 72. In the preferred embodiment, membrane 126 is formed of fluoroplastic and has a configuration which corresponds to the shape of gasket 120 and the periphery of pod door 74, exposing the center of conductive liner 124 through opening 128. A fluoroplastic membrane is impervious to gasses, preventing outgassing of the gasket into the interior region 71 of pod 72. Materials which may be used to fabricate membrane 126 include, for example, tetrafluoroethylene or polytetrafluoroethylene (Teflon™), polyamide (Kapton™), polyester (Mylar™), polypropylene, or an expanded fluoroplastic (Gore-Tex™). An expanded fluoroplastic membrane would be impervious to particles but not gasses, and thus would prevent particulate matter generated by the gasket from entering the interior region of the container.

Cassette retainer blocks 130 (alternatively called cassette guides) are fastened to pod door 74 by retainer screws 132. Cassette retainer blocks 130 provide a clamping force, through retainer screws 132, which holds conductive liner 124 in place. Cassette retainer blocks 130 function to position cassette 14 while cassette 14 rests on conductive liner 124. Alternatively, the cassette retainer blocks could be conductive and electriclay connected to pod door 74.

Figure 5:
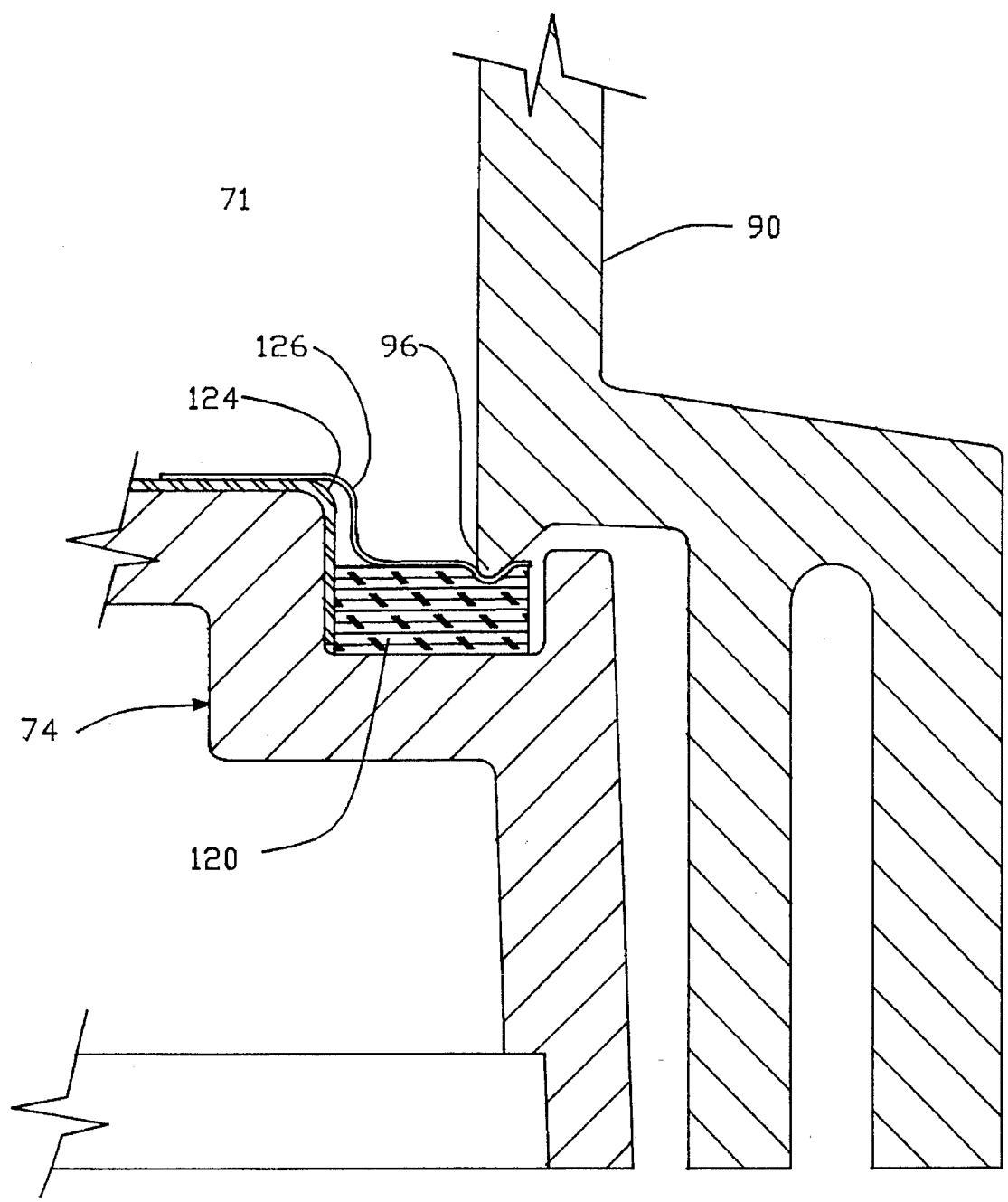
FIG. 5 is a partial, sectional view showing the interface of the second embodiment pod and pod door.

As shown in FIG. 5, box 72 has a knife edge 96 which compresses membrane 126 and gasket 120 in order to provide a seal between the box 72 and the box door 74 or, alternatively, between box 72 and liner 124. Membrane 126 prevents gasket 120, which is usually formed of a poromeric material, from outgassing into the interior region 71 of box 72.

Figure 6:
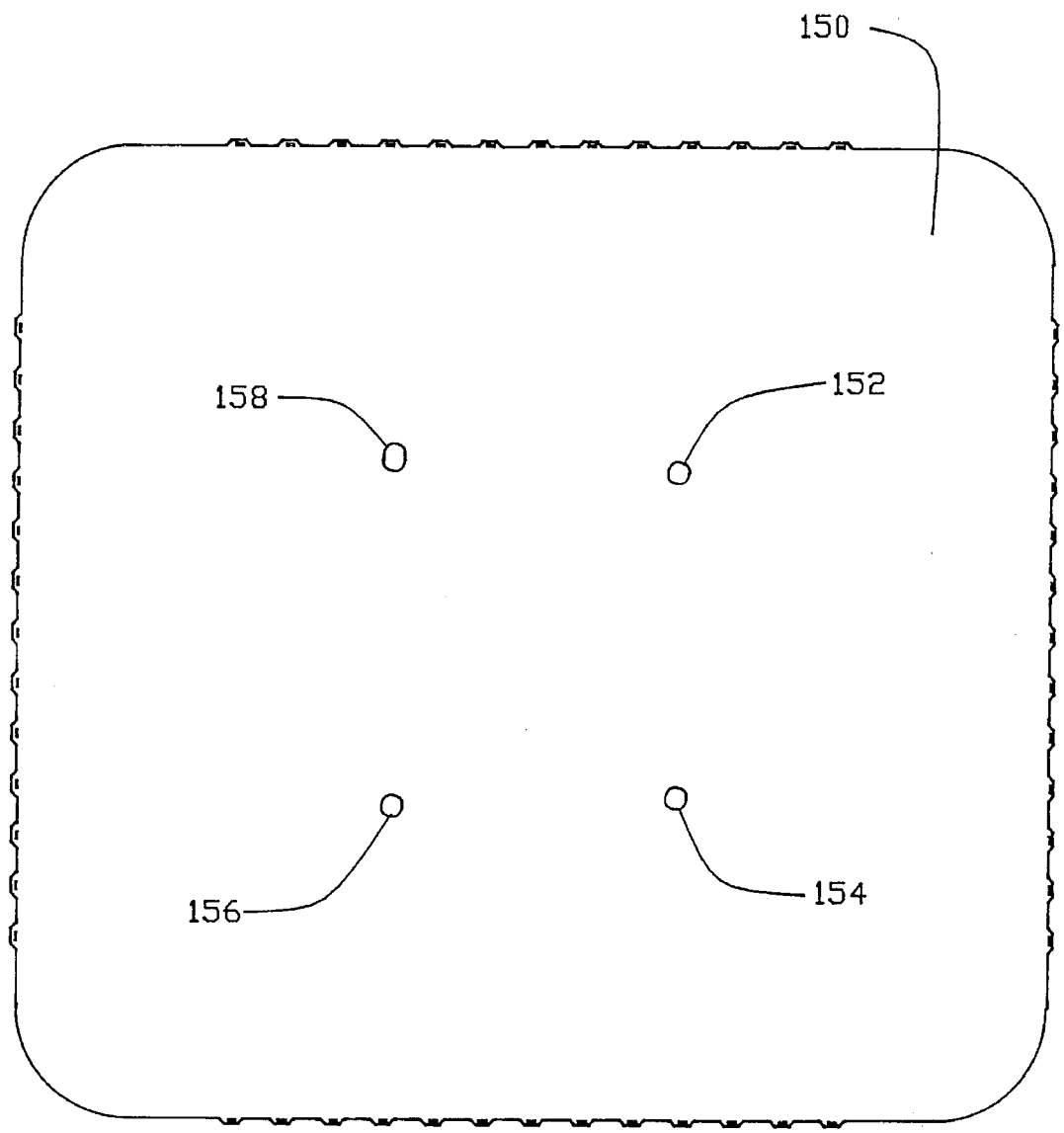
FIG. 6 is a top view of a liner for a third embodiment.

FIG. 6 shows an alternative liner 150 for a pod. Preferably, the liner 150 would be stainless steel in order to reduce electrostatic charge and outgassing. Liner 150, which has a tabbed and perforated edge, will lay flat on the inside surface of the pod door, similar to the liner 124 of FIGS. 3–5. Near the center of liner 150 are four holes 152, 154, 156 and 158, for container screws 132, which allow a cassette retainer blocks 130 to be fastened to the pod door. In order to prevent contaminants from entering interior region 71 through holes 152, 154, 156 and 158 a gasket or O-ring 131 is inserted below cassette retainer block 130. Alternatively, an O-ring or gasket can be fitted around screws 132, below liner 124.

Figure 7:
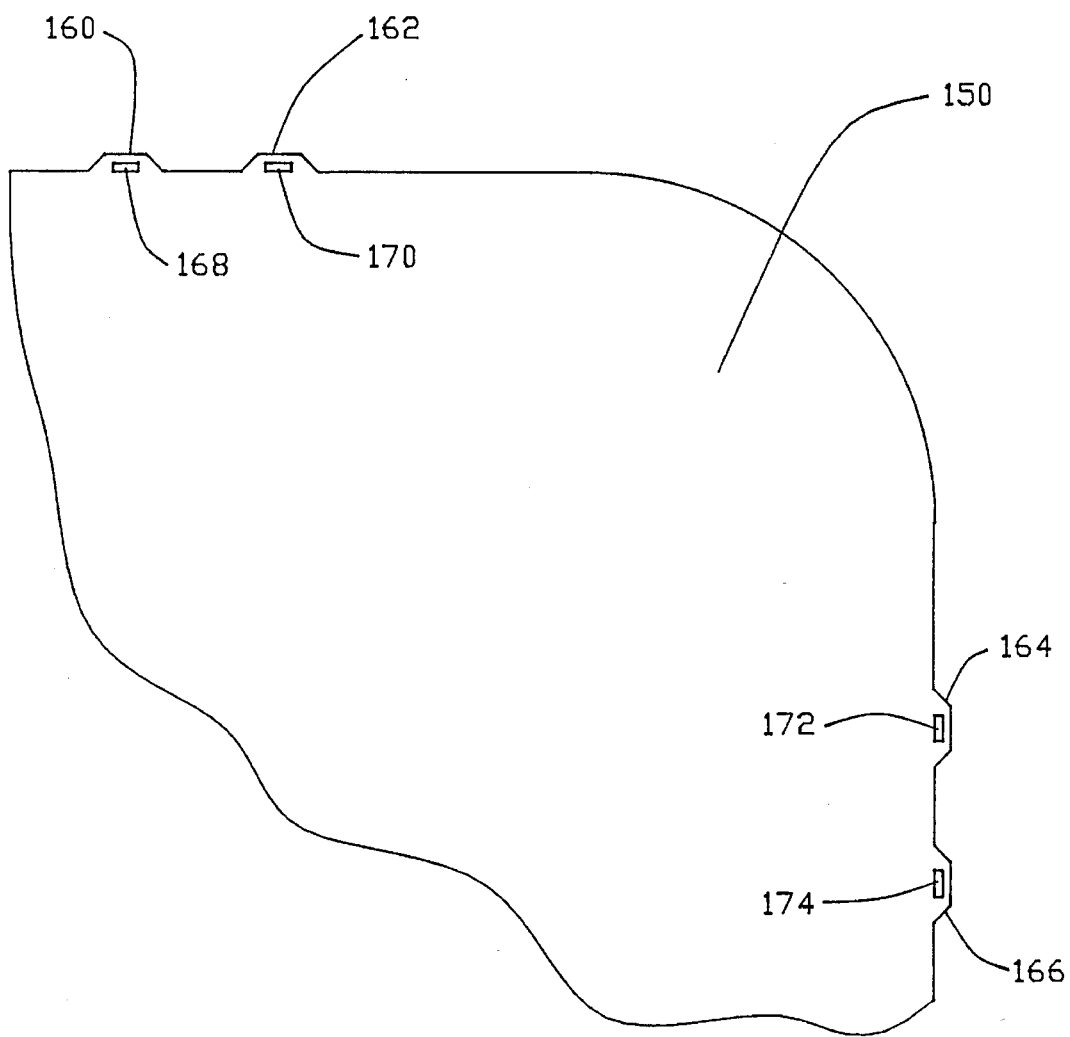
FIG. 7 is a close up view of a corner of the liner of FIG. 6.

FIG. 7 is a closeup of a corner of liner 150 showing the tabbed edge, which includes a set of tabs, for example tabs 160, 162, 164 and 166. Each tab has a hole or aperture; for example, tabs 160, 162, 164 and 166 have holes 168, 170, 172 and 174, respectively. The tabs are used to facilitate the attachment of a sealing material to the liner.

Figure 8:
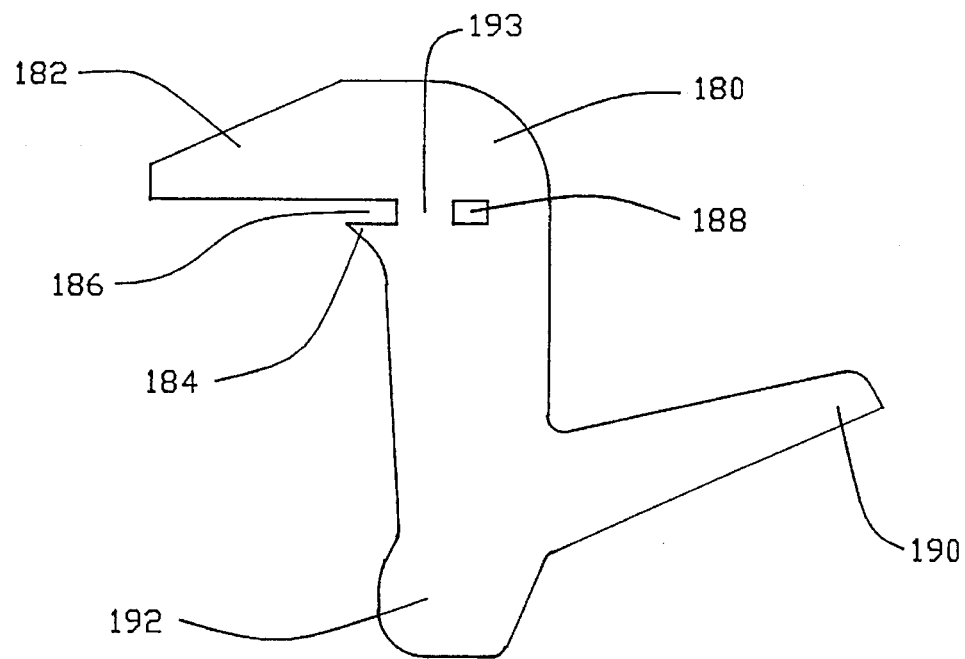
FIG. 8 is a side cutaway view of the seal for the third embodiment.

FIG. 8 shows a cross section of sealing material 180, which is used to provide a seal to isolate the interior region 71 of box 72 from ambient atmospheric conditions. Sealing material 180 includes a lip 190 for making a seal with the box, and a bead 192 for providing support for sealing material 180. Sealing material 180 also includes an upper edge 182 and upper lip 184 which combine to comprise a slot 186, which houses liner 150. Sealing material 180 further includes a series of holes, for example hole 188, which are formed when sealing material 180 is integrally molded to liner 150. Sealing material 180 is preferably molded to liner 150 so that liner 150 fits in slot 186 and within the various holes, for example hole 188. When sealing material 180 is integrally molded to liner 150, a seal is formed between sealing material 180 and liner 150. Alternatively, region 186 can be formed such that it snugly fits on the liner 150, forming a seal with liner 150, without being integrally molded to liner 150. In yet another alternative, sealing material could be bunched to liner 150 (e.g. by adhesive).

Figure 9:
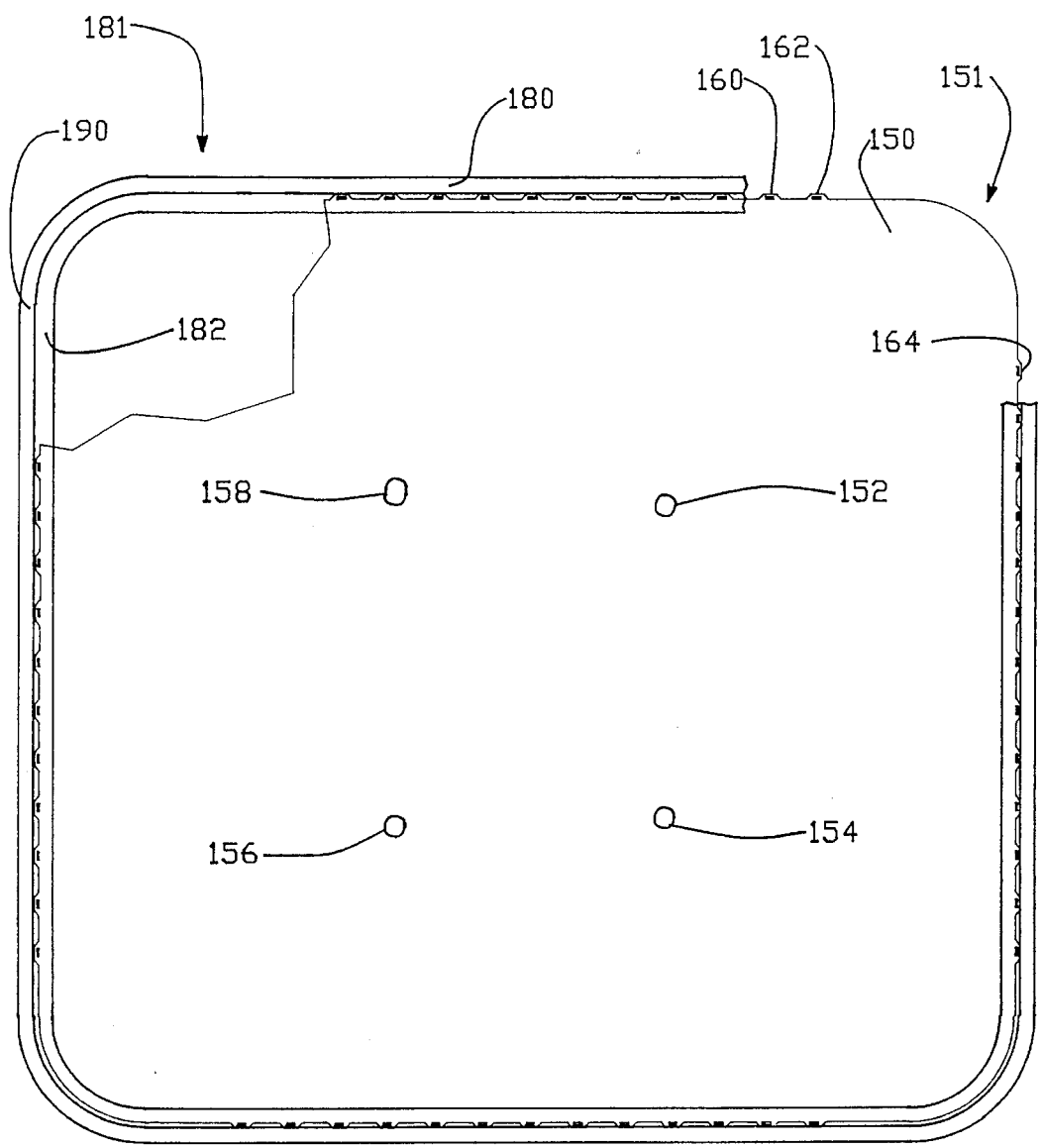
FIG. 9 shows a top view of sealing material 180 integrally molded to liner 150.

FIG. 9 shows a top view of sealing material 180 integrally molded to liner 150. Note that sealing material 180 is molded to liner 150 along the entire perimeter (or outer edge) of liner 150. In corner 181, liner 150 is cutaway for illustration purposes, showing only a top view of lip 190 and edge 182 of sealing material 180. In corner 151, sealing material 180 is cutaway for illustration purposes showing tabs 160, 162 and 164 of liner 150.

Figure 10:
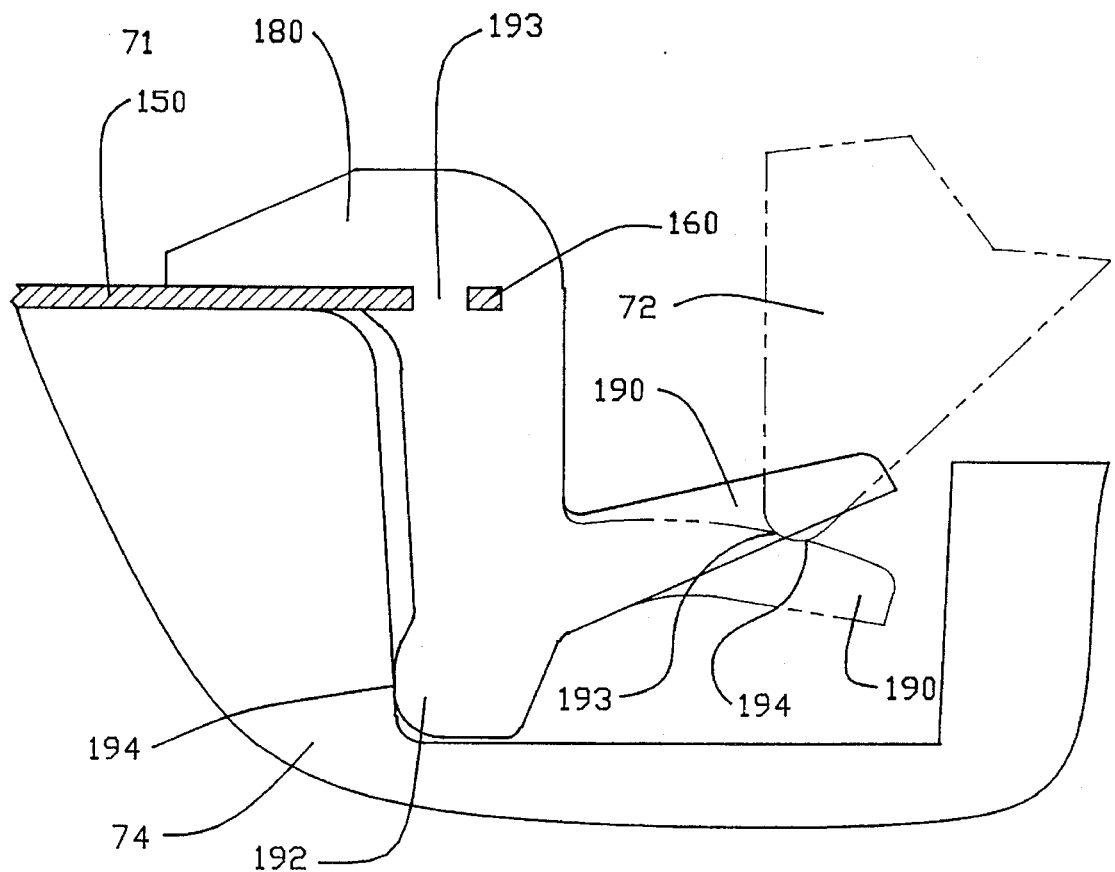
FIG. 10 is a side view of the seal of the third embodiment engaging the liner, pod and pod door.

FIG. 10 shows sealing material 180 integrally molded to liner 150, and shows lip 190 of sealing material 180 in contact with box 72. When sealing material 180 is integrally molded to liner 150, slot 186 in sealing material 180 is occupied by liner 150. Hole 188 is occupied by one of the tabs, for example, tab 160. Hole 168 in tab 160 is occupied by section 193 of sealing material 180.

Box 72 is lowered to contact lip 190 at the position where lip 190 is shown in a solid line. Box 72 is then further lowered until lip 190 is deflected to the position shown by the dotted lines, at which point a seal is formed, isolating the interior region of the pod from ambient atmospheric conditions. First, lip 190 forms a seal with box 72. Because sealing material 180 deflects rather than compresses, a sealing force is created proportional to the amount of deflection. When lip 190 forms a seal with box 72, interior region 71, which includes the space between liner 150 and box 72, is sealed via the seal at lip 190 and the seal between sealing material 180 and liner 150. Thus, the edge of box 72 and the edge of liner 150 both serve as sealing surfaces.

Further, another seal can be formed between bead 192 and region 194 of pod door 74. When lip 190 is not deflected, bead 192 will be in contact with region 194; however, bead 192 exerts very little force against region 194. Deflecting lip 190 causes bead 192 to exert a larger force against region 194 which supports sealing material 180 and causes a second seal to form.

Sealing material 180 is preferably a fluoroelastomer such as Dupont's VITON®, or Fluorel® Fluoroelastomer by 3M. However, the sealing material 180 could be made from other fluoroelastomers or other types of elastomers. These elastomers have very little or no outgassing and are impervious to chemical attacks. Elastomers are preferred over more rigid materials; for example polycarbonate or polypropylene, because the shape of an elastomer will conform to the shape of the surface the elastomer is pressed up against. Therefore, the seal will encompass a greater surface because the shape of sealing material 180 will conform to irregularities in the sealing surface of the pod or pod door. In FIG. 10, references 193 and 194 mark the location where the shape of lip 190 conforms to the sealing surface of box 90.

As shown in FIG. 10, the sealing edge of box 72 is similar to a knife edge. The reduced surface, due to the knife edged shape as compared to a flat edge, requires less force than a flat edge for the sealing material to conform to the shape of the sealing surface. Furthermore, the knife edge shape reduces seal leakage due to the risk of irregularities at the sealing surface.

During the manufacturing of sealing material 180, the fluoroelastomer in liquid state surrounds liner 150, flowing through the holes (e.g. 160, 172, 174) and curing to form integrally with the stainless steel liner 150 and making a seal with liner 150. Because sealing material 180 forms a seal with liner 150, contaminants cannot enter the pod by seeping in between the liner and the seal.

FIG. 11 shows another alternative elastomer sealing material 200 which is not integrally molded to a liner 202. Sealing material is fitted or attached to liner 202, along perimeter 203, such that a seal is formed between material 200 and liner 202. Sealing material 200 includes a lip 204 and a base 206. Similar to FIG. 10, box 72 is lowered until it contacts lip 204, when lip 204 is in the position represented by the solid line. Box 72 is lowered further until lip 204 deflects to the position represented by the dotted lines, at which point lip 204 forms a seal against box 72. References 210 and 212 denote the area of lip 204 which conforms to the shape of the sealing surface of box 72. Base 206, and specifically bump 207, provides support for sealing material 200 since sealing material 200 is not molded to liner 202. When lip 204 is deflected, base 206 pushes against box door 74 with a greater force providing support for sealing material 200, additionally may cause a seal to form at bead 207 of sealing material 200. The seals against box 72 and liner 202, can isolate the interior region 71 of the box from ambient atmospheric conditions.

FIG. 12 shows another alternative sealing material 220 integrally molded to liner 150 in a manner similar to the molding of sealing material 180 to liner 150 in FIG. 10. Sealing material 220 could be integrally molded to liner 150 such that a seal is formed between the sealing material and liner 150. Sealing material 220 has two legs, 222 and 224, and a center portion 226. Box 72 is lowered until it contacts center portion 226 when center portion 226 is in the shape indicated by the solid lines. Box 72 is lowered further causing center portion 226 to deflect to the shape represented by dotted lines, at which point sealing material 220 conforms to the shape of the sealing surface of box 72 and forms a seal with box 72. References 230 and 232 denote the area of center portion 226 which conforms to the shape of the sealing surface of box 72. The seal against box 72 and the seal between sealing material 220 and liner 150 can isolate the interior region 71 of the box from ambient atmospheric conditions. Also, when center portion 226 is deflected, leg 222 pushes against region 228 of box door 74 with a greater force causing a seal to form at region 228.

FIG. 13 shows another container 248 with an alternative sealing arrangement. Container 248 includes box 250 (or box top) and box door 252. Inside box 250 is interior region 254. On the inside surface of box door 252 is liner 256. As discussed above, liner 256 is preferably made of stainless steel. Box door 252 includes a groove 258 which runs along the perimeter of box door 252. Fitting within groove 258, and running the entire perimeter of box door 252, is a mechanical spring device 260 (or equivalent). At the top of mechanical spring device 260 is material 262, which is preferably a sealing material or rubber material that contacts liner 256 to apply a force against liner 256 pushing liner 256 against box 250. In another alternative, spring 260 may not run along the entire perimeter of box door 252, but, rather may apply pressure at a limited number of locations. Alternatively, mechanical spring device 260 and material 262 could be combined as one piece.

In between box 250 and liner 256 is first sealing material 264. Sealing material 264 can be an elastomer in the shape of a hollow ball. Therefore, when liner 256 is pressed against box 250, sealing material 264 deflects such that it conforms to the shape of the sealing surfaces of the box 250 and liner 256, possibly losing its round shape. Sealing material 264 fits within groove 265 of box 250. Sealing material 264 could be held in place in the groove 265 by a tight fit, an adhesive or being integrally molded to box 250.

At least two sealing arrangements could exist for container 248. First, interior region 254, which is to be isolated from ambient atmospheric conditions, can include the area between box 250 and liner 256. Thus, seal 264 would provide the only necessary seal to isolate interior region 254 from ambient atmospheric conditions. Box door 252 would be outside the interior region, and preventing contaminants from entering the box door would not be a concern. Alternatively, if the cleanliness of box door 252 is a concern, material 262 can be used in conjunction with mechanical device 260 to isolate interior region 254, which would then include the space between box 250 and box door 252, from ambient atmospheric conditions.

Container 248 would interface with a port in similar fashion to container 18 of FIG. 2. Box door 252 would seal against a port door and box door 250 would seal against a port plate as done in FIG. 2.

The many features and advantages of the present invention will be apparent to those skilled in the art from the Description of the Preferred Embodiments and the Drawings. Accordingly, the following claims are intended to cover all modifications and equivalents falling within the scope of the invention.

What is claimed is:

1. A sealable, transportable container, comprising:

a box having a first sealing surface and an interior region;

a box door having an interior surface;

a liner provided on the interior surface of said box door; and a compressible sealing material, said sealing material being separate from and attached to said liner so that moving said box door to a sealing position with respect to said box causes said sealing material to form a seal with the first sealing surface to isolate the interior region from ambient atmospheric conditions, said sealing material being of one piece construction.

2. A sealable, transportable container according to claim 1, wherein said sealing material is integrally molded to said liner.

3. A sealable, transportable container according to claim 2, wherein said sealing material forms a seal with said liner.

4. A sealable, transportable container according to claim 1, wherein moving said box door to the sealing position causes said sealing material to deflect.

5. A sealable, transportable container according to claim 1, wherein said liner is stainless steel and said sealing material is an elastomer.

6. A sealable, transportable container according to claim 1, wherein said liner is stainless steel and said sealing material is a fluoroelastomer.

7. A sealable, transportable container according to claim 6, wherein said sealing material is integrally molded to said liner.

8. A sealable, transportable container according to claim 1, wherein said sealing material adapted to be in continuous contact with said first sealing surface.

9. A sealable, transportable container according to claim 8, wherein said sealing material is adapted to fit along a perimeter of said box door.

10. A sealable, transportable container, comprising:

a box having a first sealing surface and an interior region;

a box door having an interior surface;

a liner provided on the interior surface of said box door; and a compressible sealing material, said sealing material being separate from and integrally molded to said liner and adapted to alter its shape so that moving said box door to a sealing position with respect to said box causes said sealing material to form a first seal with the first sealing surface, said sealing material being of one piece construction.

11. A sealable, transportable container according to claim 10, wherein said sealing material is permanently attached to said liner.

12. A sealable, transportable container according to claim 10, wherein said sealing material is permanently attached to said liner forming a replaceable unit.

13. A sealable, transportable container according to claim 10, wherein:

said liner is rigid; and said sealing material is flexible.

14. A sealable, transportable container according to claim 10, wherein said sealing material forms a second seal with said liner.

15. A sealable, transportable container according to claim 14, wherein said interior region is isolated from ambient atmospheric conditions when said box is in the sealing position.

16. A sealable, transportable container according to claim 10, wherein said box door further includes a groove for housing and supporting said sealing material.

17. A sealable, transportable container according to claim 16, wherein said sealing material includes a bead adapted to be in contact with said groove.

18. A sealable, transportable container according to claim 16, wherein said sealing material includes a bead adapted to be in contact with and form a seal with said groove.

19. A sealable, transportable container according to claim 10, wherein said sealing material includes:

a lip, adapted to bend when in contact with said first sealing surface;

a first support, adapted to support said sealable material against said box door; and an engaging portion adapted to be integrally molded to said liner.

20. A sealable, transportable container according to claim 19, wherein said first sealing surface has a knife edge shape and said lip is adapted to conform to the knife edge shape.

21. A sealable, transportable container according to claim 10, wherein said sealable material includes:

a first support and a second support, adapted to support said sealable material against said box door;

a second sealing region connected to and supported by said first and second supports, said second sealing region adapted to alter its shape and form a first seal with the first sealing surface; and an engaging portion adapted to be integrally molded to said liner.

22. A sealable, transportable container according to claim 21, wherein said first sealing surface has a knife edge shape and said second sealing region is adapted to conform to the knife edge shape.

23. A sealable, transportable container, comprising:

a box having a first sealing surface and an interior region;

a box door having a length, interior surface, a second sealing surface and a first axis along said length and parallel to said length;

a liner on the interior surface of said box door; and a sealing material including a first portion and a second portion, said first portion being adapted to deflect and form a first seal with the first sealing surface when said first sealing surface is in sealing contact with said first portion, said second portion having a third sealing surface adapted to form a second seal with said second sealing surface when said first sealing surface is in sealing contact with said first portion, said first portion being displaced from said second portion along a second axis which is not parallel or perpendicular to said first axis, said second portion not deflecting when said first sealing surface is in sealing contact with said first portion; and a latch for holding said first sealing surface in sealing contact with said first portion.

24. A sealable, transportable container according to claim 23, wherein said box door further includes a groove for housing and supporting said sealing material.

25. A sealable, transportable container according to claim 24, wherein said sealing material includes a bead adapted to be in contact with said groove.

26. A sealable, transportable container according to claim 24, wherein said sealing material includes a bead adapted to be in contact with and form said second seal with said groove.

27. A sealable, transportable container according to claim 23, wherein said sealing material includes:

a lip, adapted to bend when in contact with said first sealing surface;

a first support, adapted to support said sealable material against said box door; and an engaging portion adapted to engage said box door.

28. A sealable, transportable container according to claim 27, wherein said first sealing surface has a knife edge shape and said lip is adapted to conform to said knife edge shape.

29. A sealable, transportable container according to claim 27, wherein said box door includes a groove, said sealing material sits in said groove.

30. A sealable, transportable container according to claim 23, wherein said third portion is integrally molded to said liner.

31. A sealable, transportable container, comprising:

a box having a first sealing surface and an interior region;

a box door having an interior surface and a perimeter;

a rigid liner provided on the interior surface of the box door; and a flexible sealing material, said sealing material being separate from and integrally molded to the liner so that a first seal is formed between said liner and said sealing material, said sealing material adapted to fit along the perimeter of the box door, said sealing material including:

a lip, adapted to bend and alter its shape when in contact with said first sealing surface, said lip adapted to form a second seal with said first sealing surface;

a first support, adapted to support said sealable material against said box door; and an engaging portion adapted to be integrally molded to said liner.

32. A sealable, transportable container, comprising:

a box door having an interior surface;

a liner provided on the interior surface of said box door; and a compressible sealing material, said sealing material being separate from and integrally molded to said liner so that moving said box door to a sealing position with respect to said box causes said sealing material to be in contact with said first sealing surface, said sealing material being of one piece construction.

* * * * *

UNITED STATES PATENT AND TRADEMARK OFFICE
CERTIFICATE OF CORRECTION

PATENT NO. : 5,611,452
DATED : March 18, 1997
INVENTOR(S) : Bonora, et al.

It is certified that error appears in the above-indentified patent and that said Letters Patent is hereby corrected as shown below:

Col. 1, line 14: after "following" delete "Applications/".

Col. 7, line 51: delete "space".

Signed and Sealed this

Ninth Day of September, 1997

Attest:

BRUCE LEHMAN

*Attesting Officer*   Commissioner of Patents and Trademarks